(12) United States Patent
Zitlaw et al.

(10) Patent No.: US 8,417,874 B2
(45) Date of Patent: Apr. 9, 2013

(54) HIGH SPEED MEMORY HAVING A PROGRAMMABLE READ PREAMBLE

(75) Inventors: Clifford Alan Zitlaw, Chico, CA (US); Anthony Le, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 528 days.

(21) Appl. No.: 12/691,633

(22) Filed: Jan. 21, 2010

(65) Prior Publication Data
US 2011/0179215 A1 Jul. 21, 2011

(51) Int. Cl.
*G06F 12/00* (2006.01)
(52) U.S. Cl.
USPC .......................... 711/103; 711/104; 711/163
(58) Field of Classification Search .................. 711/103, 711/104, 163
See application file for complete search history.

(56) References Cited

U.S. PATENT DOCUMENTS

| | | | |
|---|---|---|---|
| 7,002,378 B2 | 2/2006 | Srikanth et al. | |
| 7,218,557 B1 | 5/2007 | Chlipala et al. | |
| 7,394,721 B1 | 7/2008 | Vemula | |
| 7,508,723 B2 | 3/2009 | Goodwin et al. | |
| 7,558,133 B2 | 7/2009 | Choi et al. | |
| 7,571,279 B2 | 8/2009 | Sade et al. | |
| 7,590,789 B2 | 9/2009 | Rashid | |
| 7,624,209 B1 | 11/2009 | Ansari et al. | |
| 7,636,274 B2 | 12/2009 | Solomon et al. | |
| 2006/0119384 A1* | 6/2006 | Camarota et al. | 326/38 |

\* cited by examiner

*Primary Examiner* — Jasmine Song
(74) *Attorney, Agent, or Firm* — Turocy & Watson, LLP

(57) ABSTRACT

The subject systems and/or methods relate to a high speed memory device that enables a preamble pattern to be updated after manufacture. A high speed memory device can include a FLASH module and a RAM module. The FLASH module can include an initial preamble pattern, wherein the initial preamble pattern is loaded during a power-up of the high speed memory. The RAM module can include a default preamble pattern, wherein the default preamble pattern is loaded after the power-up of the high speed memory. The initial preamble pattern or the default preamble pattern can be defined by a manufacture of the high speed memory or an OEM of the high speed memory. Additionally, the initial preamble pattern or the default preamble pattern can be updated with a customized preamble pattern based upon a target environment.

20 Claims, 9 Drawing Sheets ns. In particular, FLASH memory is a type of electronic memory media that can be rewritten and that can retain content without consumption of power. Unlike dynamic random access memory (DRAM) devices and static random memory (SRAM) devices in which a single byte can be erased, FLASH memory devices are typically erased in fixed multi-bit blocks or sectors. FLASH memory technology can include NOR FLASH memory and/or NAND FLASH memory, for example. FLASH memory devices typically are less expensive and denser as compared to many other memory devices, meaning that FLASH memory devices can store more data per unit area.

HIGH SPEED MEMORY HAVING A PROGRAMMABLE READ PREAMBLE

TECHNICAL FIELD

The subject innovation relates generally to memory systems and in particular to systems and methods that enable preamble pattern definition after memory device manufacture.

BACKGROUND

A wide variety of memory devices can be used to maintain and store data and instructions for various computers and similar systems. In particular, FLASH memory is a type of electronic memory media that can be rewritten and that can retain content without consumption of power. Unlike dynamic random access memory (DRAM) devices and static random memory (SRAM) devices in which a single byte can be erased, FLASH memory devices are typically erased in fixed multi-bit blocks or sectors. FLASH memory technology can include NOR FLASH memory and/or NAND FLASH memory, for example. FLASH memory devices typically are less expensive and denser as compared to many other memory devices, meaning that FLASH memory devices can store more data per unit area.

FLASH memory has become popular, at least in part, because it combines the advantages of the high density and low cost of EPROM with the electrical erasability of EEPROM. FLASH memory is nonvolatile; it can be rewritten and can hold its content without power. It can be used in many portable electronic products, such as cell phones, portable computers, voice recorders, thumbnail drives and the like, as well as in many larger electronic systems, such as cars, planes, industrial control systems, etc. The fact that FLASH memory can be rewritten, as well as its retention of data without a power source, small size, and light weight, have all combined to make FLASH memory devices useful and popular means for transporting and maintaining data.

DRAM utilizes separate capacitor within an integrated circuit in order to store each bit of data. Without a periodic capacitor charge, the information stored within DRAM can eventually fade based upon capacitors leaking charge. In other words, DRAM is a type of dynamic memory as opposed to FLASH memory that is static type of memory. Generally, DRAM provides structural simplicity since a single transistor and capacitor are implemented for each bit stored. This also enables a very high density to be stored with DRAM memory.

In conventional computing systems, DRAM technology has typically been employed to operate the dynamic memory of the computer in order for an application to operate at high speeds. Slower speed memories such as hard drives and FLASH technology have been utilized for non-volatile long term storage requirements. As previously noted, FLASH can provide lower power consumption with higher density capability per package size as DRAM. It would be desirable if some of the advantages of FLASH technology could be exploited to support many of the applications that are currently running with DRAM technology. Unfortunately, there currently are bandwidth issues with FLASH that would not allow for a direct substitution with existing DRAM applications.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Systems and/or methods are presented that facilitate programming a high speed memory with a customized preamble pattern post manufacture of the high speed memory. A high speed memory can include at least one of a RAM module or a FLASH module that includes preamble patterns, wherein such preamble patterns can be updated with customized preamble patterns based upon a host environment in which the high speed memory is employed. By leveraging the RAM module or the FLASH module, the preamble patterns can be updated with a customized preamble pattern tailored to a target environment providing a more specific employment of high speed memory. The preamble patterns stored within the RAM module and/or the FLASH module associated with the high speed memory can be updated after the manufacture of the high speed memory. In other words, high speed memory can be updated with environment-specific preamble patterns regardless of the initial preamble pattern stored in the FLASH module or the default preamble pattern stored in the RAM module. Additionally, the default preamble pattern can be the initial preamble pattern. The RAM pattern can be loaded by the non-volatile pattern (e.g., Flash or some sort of ROM) during power-up.

In accordance with an aspect of the subject innovation, a memory device is provided that can include a FLASH module with an initial preamble pattern, wherein the initial preamble pattern can be updated with a customized preamble pattern. In accordance with another aspect of the subject innovation, a memory device is provided that can include a RAM module with a default preamble pattern, wherein the default preamble pattern can be updated with a customized preamble pattern. In accordance with another aspect of the subject innovation, a memory device is provided that can include a FLASH module with an initial preamble pattern and a RAM module with a default preamble pattern, wherein at least one of the initial preamble pattern or the default preamble pattern can be updated with a customized preamble pattern. The memory device can enable a preamble pattern to be updated with a customized preamble pattern after the manufacture of the high speed memory. Moreover, methods are provided that facilitates programming a high speed memory with a customized preamble pattern based upon a target environment.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Systems and/or methods are presented that facilitate programming a high speed memory with a customized preamble pattern post manufacture of the high speed memory. In particular, a high speed memory can include at least one of a RAM module or a FLASH module that can include preamble patterns, wherein such preamble patterns can be updated with customized preamble patterns based upon a host environment in which the high speed memory is employed. In other words, the high speed memory can include an initial preamble pattern within a FLASH module and a default preamble pattern within a RAM module. Such initial preamble pattern and/or default preamble pattern can be updated with a customized preamble pattern that is specifically tailored to the target environment in which the high speed memory is to be utilized.

In general, read preambles can be used in high speed memory devices to allow for an orderly transition from one bus transaction to the next transaction. Such technique can allow two bus masters to simultaneously drive a dedicated data strobe to the low state during a brief handover period. Because both masters are driving the data strobe low during this turnaround time there are no contention issues.

Figure 1:
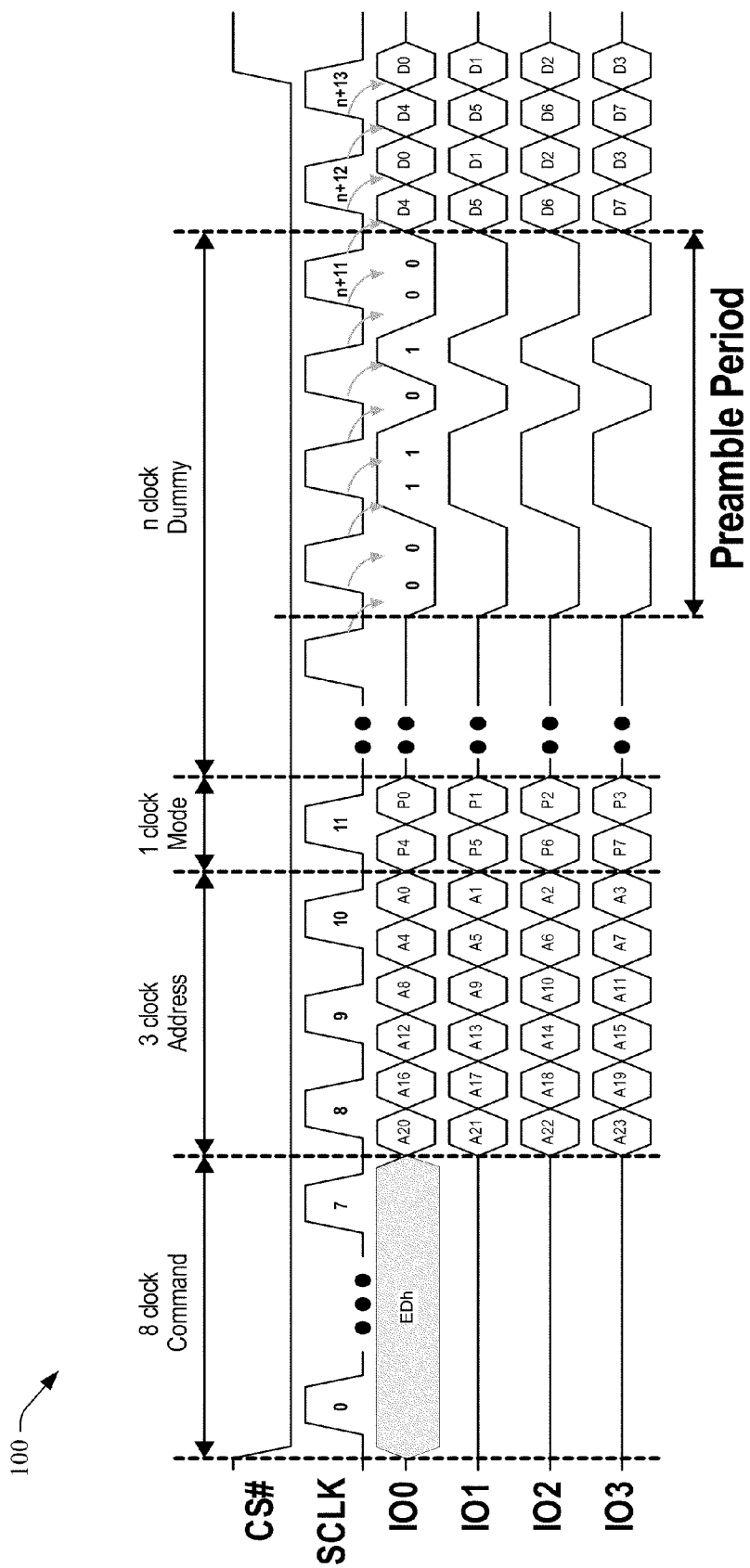
FIG. 1 illustrates a timing diagram of a read operation using a preamble for a serial memory.

Referring initially to FIG. 1, a timing diagram 100 of a read operation using a preamble for a serial memory is illustrated. A preamble strategy can be to use the idle bus cycles on the data bus to issue a read preamble. This preamble technique provides information regarding which clock cycle can be used for the initial data value to be output and also the relative skew of data with respect to the clock edges. The timing diagram 100 illustrates a read operation using a preamble that is output just prior to data being driven onto the bus. A bus protocol shown in the timing diagram 100 does not have the same possibility for contention that occurs in other memory interfaces but the preamble is valuable to identify when the first data value will arrive and how data is skewed relative to the clock edges. For example, the pattern for the preamble 00110100b can be chosen to give the host controller adequate information to successfully capture the subsequent data output by the memory device.

The subject innovation enables the preamble pattern within high speed memory to be customized and/or tailored to a specific target environment. In general, the high speed memory preamble pattern can be updated or changed from at least one of an initial preamble pattern stored on a FLASH module or a default preamble pattern stored on a RAM module. For example, the high speed memory can be manufactured with the initial preamble pattern on a FLASH module and/or the default preamble pattern on a RAM module, and a customized preamble pattern can be updated to the high speed memory. Such update or customized preamble pattern can be based upon a host system, a target environment, and/or a command/instruction to program the preamble pattern.

Generally, preambles can be used in RAM devices (e.g., DRAM devices, etc.) but can be associated with dedicated data strobe signals and not the data signals. The data strobe based preambles may not include a training pattern. Some RAM devices can have registers that provide a training pattern during dedicated read operations but the value of the pattern is fixed. The subject innovation can allow an entity (e.g., an OEM) to decide what preamble pattern is optimal for a particular use situation. Different patterns can be attractive given the target operating environment. For example, a shorter preamble can be selected based upon an environment that includes a slower clock rate.

Other implementations of data training can either use a fixed pattern or preamble images stored in the memory array. The subject innovation can give an entity (e.g., the OEM) an ability to change the preamble pattern and length depending upon the target usage case. The subject innovation can include a technique where the preamble pattern can be defined after the memory device has been manufactured. Generally, the subject innovation can relate to enabling customized preamble patterns for high speed memory, wherein the preamble is output just prior to data being driven onto the bus. Moreover, it is to be appreciated that the subject innovation can be utilized in non-memory devices that employ preamble patterns.

Figure 2:
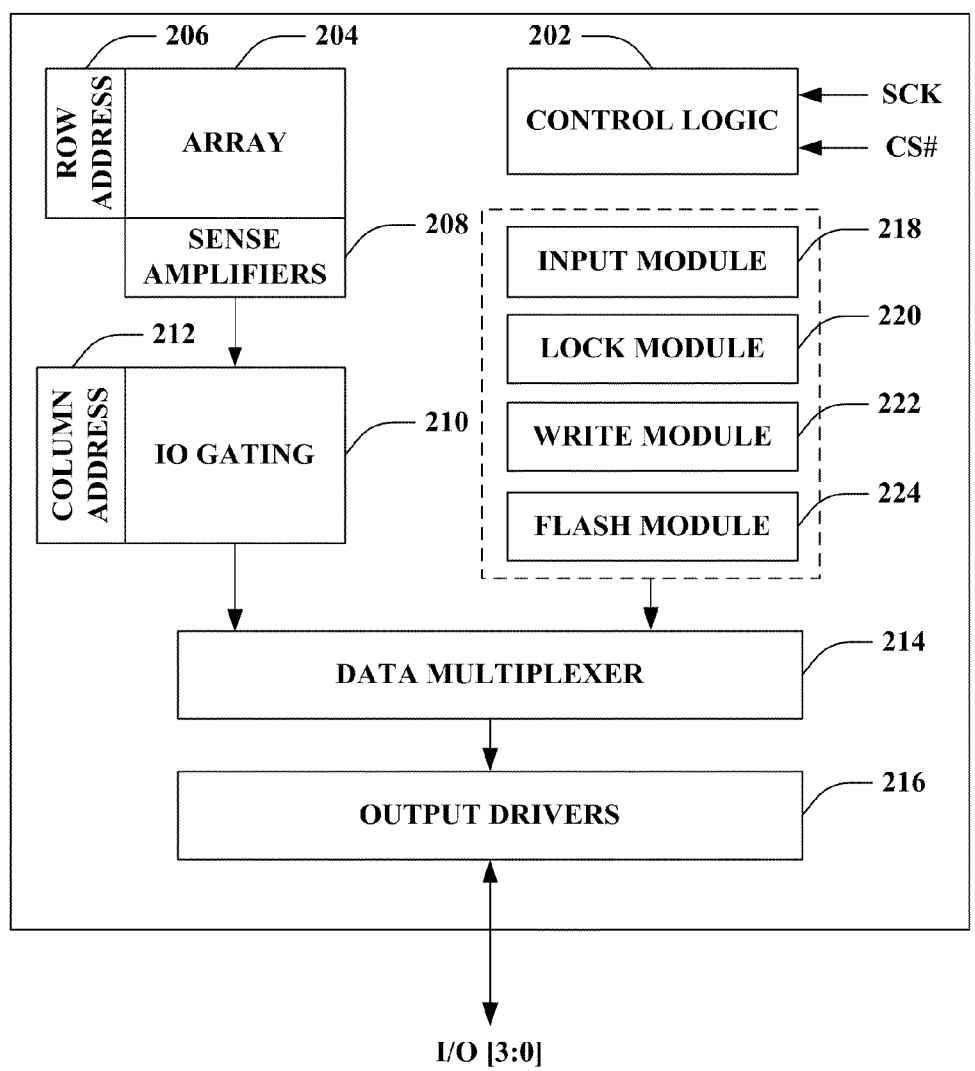
FIG. 2 depicts a block diagram of a memory device with preamble pattern memory in accordance with the subject innovation.

FIG. 2 illustrates a memory device 200 with a FLASH module that stores a preamble pattern. The memory device 200 can include a control logic 202, an array 204, a row address 206, a sense amplifiers 208, an IO gating 210, a column address 212, a data multiplexer 214, and an output drivers 216. The memory device 200 can leverage a preamble pattern in order to enable a host controller to capture data output by the high speed memory. Moreover, the memory device 200 can utilize a preamble pattern (e.g., an initial preamble pattern, a default preamble pattern, a customized preamble pattern, etc.) to identify when a first data value arrives and data adjustment relative to a clock edge.

The memory device 200 can further include an input module 218, a lock module 220, a write module 222, and a FLASH module 224. The memory device 200 can enable a high speed memory to be programmed with a preamble pattern that is customized to a target environment. In particular, the memory device 200 can include a FLASH module 224, wherein the FLASH module 224 can be any suitable FLASH memory or device that can store a portion of a preamble pattern (e.g., an initial preamble pattern, etc.). The memory device 200 that includes the FLASH module 224 can enable a high speed memory (e.g., the memory device 200) or high speed memory device to be updated with a preamble pattern that is different than an initial preamble pattern defined by the high speed memory manufacture or OEM of the high speed memory. It is to be appreciated that the memory device 200 can be referred to as the high speed memory, the high speed memory device, and the like. The FLASH module 224 can be programmed with an initial preamble pattern and updated (e.g., reprogrammed) with a customized preamble pattern, wherein the customized preamble pattern is tailored to a host environment.

The memory device 200 can leverage the FLASH module 224 in order to allow the preamble pattern to be programmed either by the manufacturer of the high speed memory or the OEM of the high speed memory. For instance, as described below, the preamble pattern can be programmed initially by the manufacturer or the OEM and can be locked or restricted (e.g., reprogrammable, One Time Programmable (OTP), etc.) or the value can be allowed to be erased and then reprogrammed.

The memory device 200 can include the input module 218 that can receive at least one of an initial preamble pattern, a preamble pattern, and/or a customized preamble pattern. The input module 128 can receive the initial preamble pattern from, for example, a high speed memory manufacture, an OEM of the high speed memory, a host system, a target environment, a system manufacture, and/or any suitable entity (e.g., user, group of users, enterprise, factory, business, plant, company, machine, etc.) that can employ a high speed memory that utilizes a preamble pattern.

It is to be appreciated that the customized preamble pattern can be specifically tailored based upon a target environment or a user instruction (e.g., user-defined, entity-defined, etc.). For instance, the customized preamble pattern can be specifically tailored in regards to a length of a preamble, a pattern, etc. For example, preamble length can be an 8 bit length. Longer and shorter lengths can also be employed. Longer preambles can be utilized to more accurately calibrate the data capture point. Shorter preambles can be utilized in some circumstances to minimize the number of clocks required between the command/address definition and the initial data value. The ability to adjust the preamble length can also be a programmable feature.

The memory device 200 can further include the lock module 220 and the write module 222. The write module 222 can erase and/or write the data stored on the FLASH module 224, wherein the data can be an initial preamble pattern, a preamble pattern, and/or a customized preamble pattern. Additionally, the lock module 220 can restrict the erase (e.g., programming) and/or write (e.g., programming) to the FLASH module 224. For example, the lock module 220 can restrict a write or an erase to the FLASH module 224 based upon a number of writes, a number of erases, a password request, an authorization, and the like.

Figure 3:
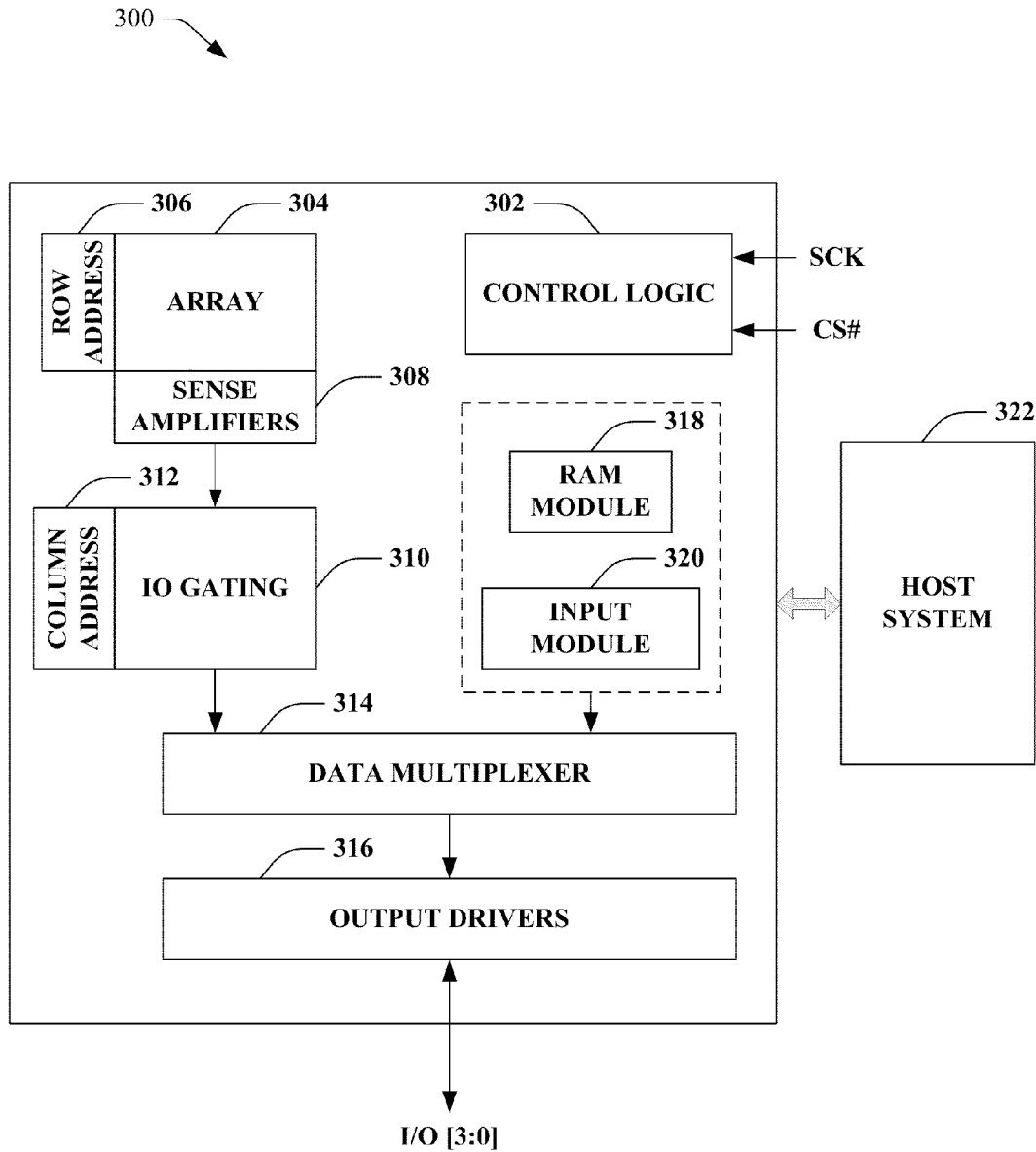
FIG. 3 illustrates a block diagram of a memory device with preamble pattern memory in accordance with the subject innovation.

Referring to FIG. 3, a memory device 300 that includes a RAM module for storing preamble patterns is illustrated. The memory device 300 can include a control logic 302, an array 304, a row address 306, a sense amplifiers 308, an IO gating 310, a column address 312, a data multiplexer 314, and an output drivers 316. The memory device 300 can leverage a preamble pattern in order to enable a host controller to capture data output by the high speed memory (e.g., the memory device 300). Moreover, the memory device 300 can utilize a preamble pattern (e.g., an initial preamble pattern, a default preamble pattern, a customized preamble pattern, etc.) to identify when a first data value arrives and data adjustment relative to a clock edge.

The memory device 300 can enable a high speed memory to be programmed with a preamble pattern that is customized to a target environment. In particular, the memory device 300 can include a RAM module 318, wherein the RAM module 318 can be any suitable RAM memory or device that can store a portion of a preamble pattern (e.g., a default preamble pattern, etc.). The memory device 300 that includes the RAM module 318 can enable a high speed memory or high speed memory device to be updated with a preamble pattern that is different than a default preamble pattern defined by the high speed memory manufacture or OEM of the high speed memory. The RAM module 318 can be programmed with a default preamble pattern and updated (e.g., reprogrammed) with a customized preamble pattern, wherein the customized preamble pattern is tailored to a host environment.

The memory device 300 can include an input module 320 that can receive a customized preamble pattern via the host system 322. It is to be appreciated that the customized preamble pattern can be specifically tailored based upon a target environment (e.g., host system, etc.) or a user instruction (e.g., user-defined, entity-defined, etc.). For instance, the customized preamble pattern can be specifically tailored in regards to a length of a preamble, a pattern, etc. For example, preamble length can be an 8 bit length. Longer and shorter lengths can also be employed. Longer preambles can be utilized to more accurately calibrate the data capture point. Shorter preambles can be utilized in some circumstances to minimize the number of clocks required between the command/address definition and the initial data value. The ability to adjust the preamble length can also be a programmable feature.

A host system 322 can define a customized preamble pattern or value prior to using any read operation that includes the preamble in a protocol. It is to be appreciated that the host system 322 can be any suitable machine, computer, hardware, software, or portion thereof that can utilize the high speed memory. In general, the memory device 300 can leverage the host system 322 to load a customized preamble pattern after a power-up of the high speed memory. Thus, regardless of the default preamble pattern stored on the RAM module 318, the host system 322 can update and/or utilize a customized preamble pattern with the RAM module 318 for the high speed memory.

Figure 4:
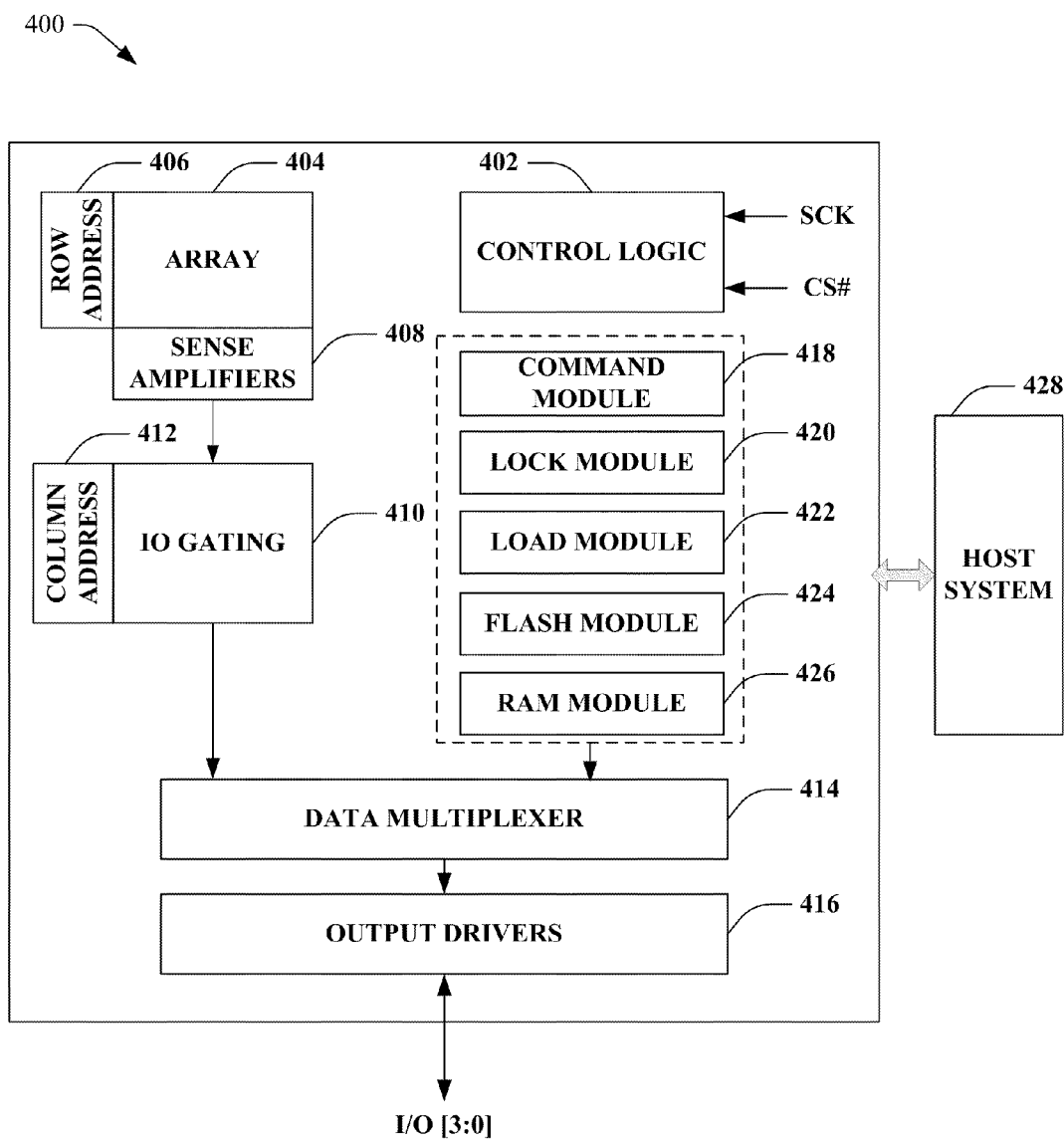
FIG. 4 illustrates a block diagram of a memory device with preamble pattern memory in accordance with the subject innovation.

Although not shown, the system 300 can leverage a lock module and/or write module that can employ a locking mechanism. The write module can erase and/or write the data stored on the RAM module 318, wherein the data can be a default preamble pattern, a customized preamble pattern, and the like. Additionally, the lock module can restrict the erase (e.g., programming) and/or write (e.g., programming) to the RAM module 318. For example, the lock module can restrict a write or an erase to the RAM module 318 based upon a number of writes, a number of erases, a password request, an authorization, and the like FIG. 4 depicts a memory device 400 that facilitates implementing a FLASH module and a RAM module in order to utilize customized preamble patterns within high speed memory. The memory device 400 can include a control logic 402, an array 404, a row address 406, a sense amplifiers 408, an IO gating 410, a column address 412, a data multiplexer 414, and an output drivers 416. The memory device 400 can leverage a preamble pattern in order to enable a host controller to capture data output by the high speed memory. Moreover, the memory device 400 can utilize a preamble pattern (e.g., an initial preamble pattern, a default preamble pattern, a customized preamble pattern, etc.) to identify when a first data value arrives and data adjustment relative to a clock edge.

The memory device 400 can leverage a FLASH module 424 and a RAM module 426. The FLASH module 424 can be any suitable FLASH memory or device that can store a portion of a preamble pattern (e.g., an initial preamble pattern, etc.). It is to be appreciated that the initial image for a RAM based memory product would have to define the initial/default preamble value in some sort of non-volatile memory that would probably not be programmable in the field (e.g., metal option, laser "trimmable", PROM, etc.). The RAM module 426 can be any suitable RAM memory or device that can store a portion of a preamble pattern (e.g., a default preamble pattern, etc.). The RAM module 426 can be utilized to define a default preamble pattern but an initial RAM value (e.g., initial preamble pattern) can be loaded from the FLASH module 424 during power-up. After power-up, the RAM value (e.g., initial preamble pattern) can be altered by a host system 428. It is to be appreciated that the host system 428 can be any suitable machine, computer, hardware, software, or portion thereof that can utilize the high speed memory. In general, during a power-up of the high speed memory, the initial preamble pattern stored within the FLASH module 424 can be loaded and after the power-up of the high speed memory, the default preamble pattern stored within the RAM module 426 can be loaded. Moreover, at least one of the initial preamble pattern or the default preamble pattern can be updated with a customized preamble pattern that is based upon a target environment of the high speed memory.

A command based FLASH to RAM transfer (e.g., FLASH module 424 to RAM module 426 transfer) can also be allowed after power-up. Furthermore, as discussed below, locking the FLASH module 424 can be employed. A locking mechanism for the volatile RAM value (e.g., default preamble pattern within the RAM module 426) can be implemented based upon a device reset or a next power-up.

The memory device 400 can include a command module 418 that can receive and/or implement commands to transfer data between the FLASH module 424 and the RAM module 426. Additionally, the memory device 400 can include a load module 422 that can load (e.g., program) a customized preamble pattern to at least one of the FLASH module 424 or the RAM module 426. The memory device 400 can further include a lock module 420 that can restrict programming (e.g., a writing, an erasing, etc.) of at least one of the FLASH module 424 or the RAM module 426. For example, the lock module 420 can restrict a write or an erase to at least one of the FLASH module 424 or the RAM module 426 based upon a number of writes, a number of erases, a password request, an authorization, and the like.

The subject innovation can implement an infrastructure used to specify a preamble pattern after the device (e.g., a high speed memory) has been manufactured. Programmable memory can be used to allow either the memory manufacturer or the system manufacturer to specify a desired preamble pattern. The memory device 400 can include both a FLASH module 424 and a RAM module 426 to define a preamble pattern. The RAM image (e.g., default preamble pattern) can be loaded upon power-up with the preamble value stored in the FLASH module 424 and can be altered after power-up by a host system 428. The FLASH image (e.g., initial preamble pattern) can be programmed with the preamble pattern either by a memory manufacturer or by a system manufacturer.

It is to be appreciated that the customized preamble pattern can be specifically tailored based upon a target environment or a user instruction (e.g., user-defined, entity-defined, etc.). For instance, the customized preamble pattern can be specifically tailored in regards to a length of a preamble, a pattern, etc. For example, preamble length can be an 8 bit length. Longer and shorter lengths can also be employed. Longer preambles can be utilized to more accurately calibrate the data capture point. Shorter preambles can be utilized in some circumstances to minimize the number of clocks required between the command/address definition and the initial data value. The ability to adjust the preamble length can also be a programmable feature.

FIGS. 5-8 illustrate example process methodologies for programming preamble pattern memory with customized preamble patterns based upon a target environment, wherein the preamble pattern memory can include a FLASH module and/or a RAM module. While, for purposes of simplicity of explanation, the processes or methodologies are shown and described as a series or number of acts, it is to be understood and appreciated that the subject processes are not limited by the order of acts, as some acts may, in accordance with the subject processes, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the subject processes described herein.

Figure 5:
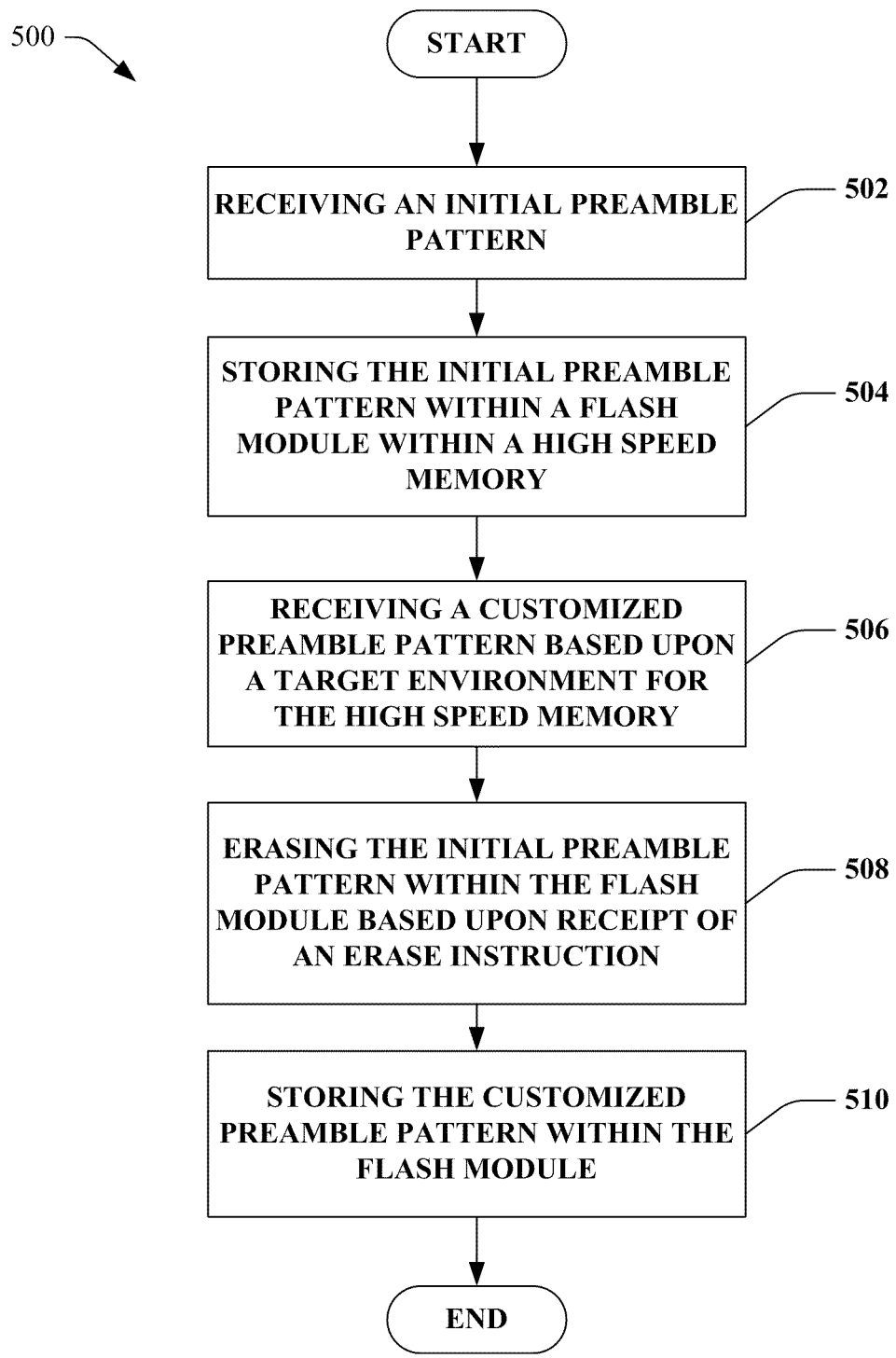
FIG. 5 illustrates an example methodology for utilizing a FLASH module to enable customized preamble patterns to be employed with a high speed memory.

FIG. 5 illustrates a methodology 500 that enables a high speed memory with an initial preamble pattern to be programmed with a customized preamble pattern based upon a target environment. At reference numeral 502, an initial preamble pattern can be received. For example, the initial preamble pattern can be received from, but not limited to, a high speed memory manufacture, an OEM of the high speed memory, a host system, a target environment, a system manufacture, and/or any suitable entity (e.g., user, group of users, enterprise, factory, business, plant, company, machine, etc.) that can employ a high speed memory that utilizes a preamble pattern. At reference numeral 504, the initial preamble pattern can be stored within a FLASH module within a high speed memory. At reference numeral 506, a customized preamble pattern based upon a target environment for the high speed memory can be received. For example, the customized preamble pattern can be customized based upon length of the preamble, the pattern, etc. At reference numeral 508, the initial preamble pattern within the FLASH module can be erased based upon receipt of an erase instruction. In one example, the initial preamble pattern can be erased based upon receipt of the customized preamble pattern. At reference numeral 510, the customized preamble pattern can be stored within the FLASH module. Moreover, the customized preamble pattern can be utilized in connection with the high speed memory.

Figure 6:
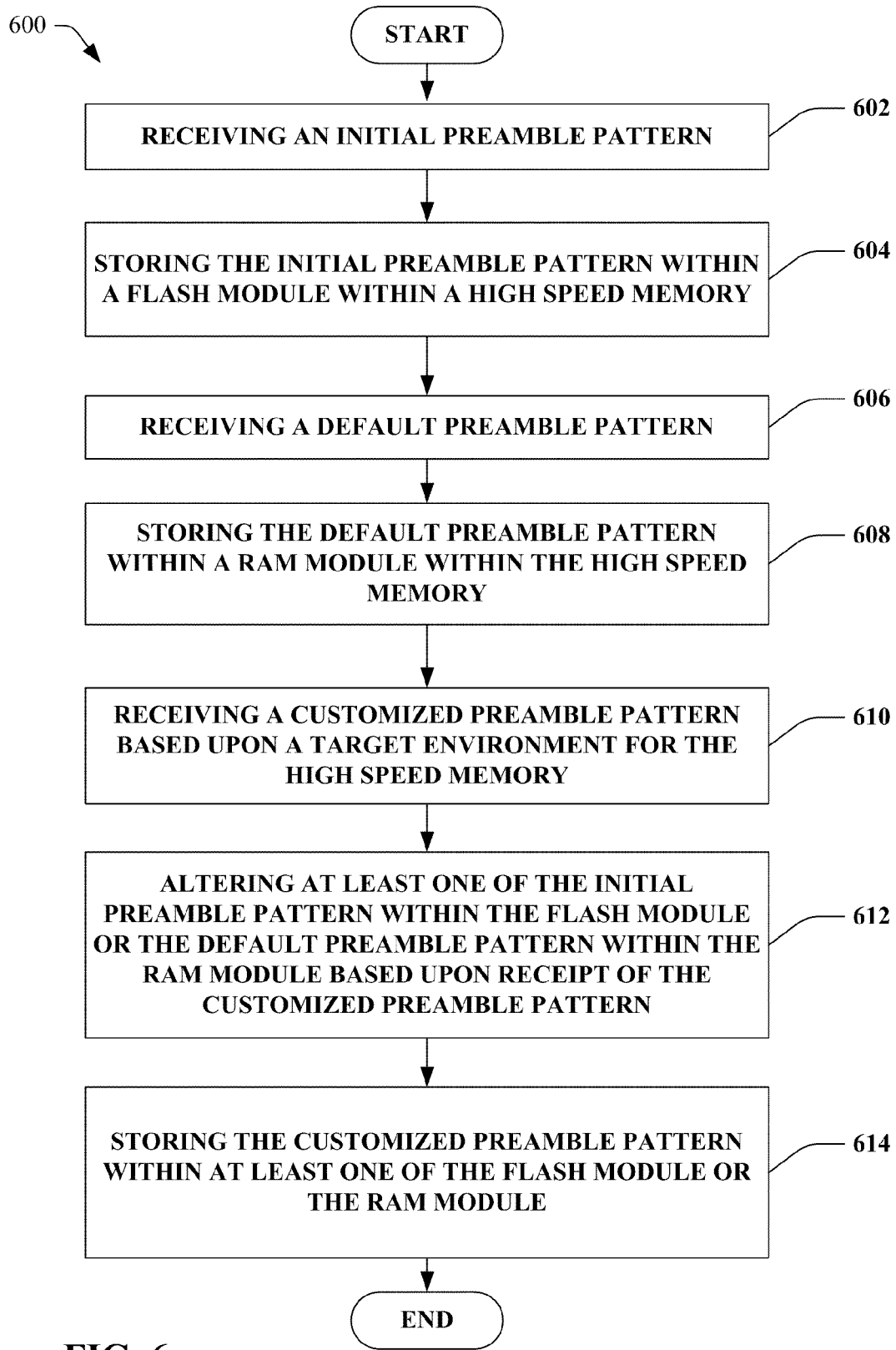
FIG. 6 illustrates an example methodology for utilizing a FLASH module and a RAM module to enable customized preamble patterns to be employed with a high speed memory.

FIG. 6 illustrates a methodology 600 that leverages a RAM module and/or a FLASH module within a high speed memory to employ customized preamble patterns. At reference numeral 602, an initial preamble pattern can be received. For example, the initial preamble pattern can be received via a high speed manufacture, an OEM, a host system, a system manufacture, a target environment, and/or any suitable entity (e.g., user, group of users, enterprise, factory, business, plant, company, machine, etc.) that can employ a high speed memory that utilizes a preamble pattern. At reference numeral 604, the initial preamble pattern can be stored within a FLASH module within a high speed memory. At reference numeral 606, a default preamble pattern can be received. For example, the initial preamble pattern can be received via a high speed manufacture, an OEM, a host system, a system manufacture, and/or a target environment. At reference numeral 608, the default preamble pattern can be stored within a RAM module within the high speed memory.

At reference numeral 610, a customized preamble pattern based upon a target environment for the high speed memory can be received. For instance, the customized preamble pattern can be received from, but not limited to, an OEM related to the high speed memory, a host system within the target environment of the high speed memory, a high speed memory manufacture, and/or any suitable entity (e.g., user, group of users, enterprise, factory, business, plant, company, machine, etc.) that can employ a high speed memory that utilizes a preamble pattern. At reference numeral 612, at least one of the initial preamble pattern within the FLASH module or the default preamble pattern within the RAM module can be altered (e.g., erased for the FLASH module, written for the RAM module, programmed for the RAM module, etc.) based upon receipt of the customized preamble pattern. At reference numeral 614, the customized preamble pattern can be stored within at least one of the FLASH module or the RAM module.

Figure 7:
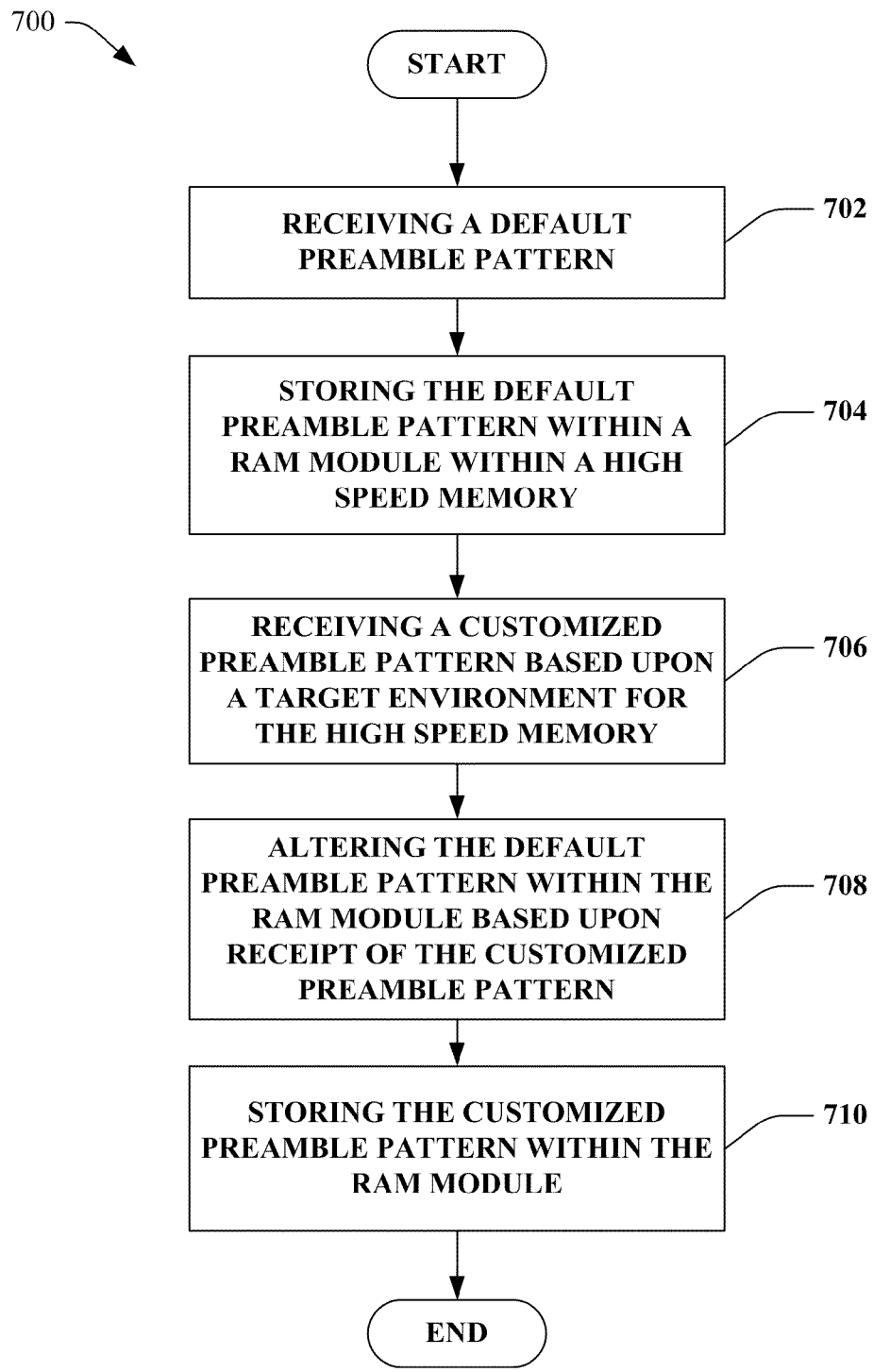
FIG. 7 illustrates an example methodology for utilizing a RAM module to enable customized preamble patterns to be employed with a high speed memory.

FIG. 7 illustrates a methodology 700 that implements a RAM module within a high speed memory to store a default preamble pattern and/or a customized preamble pattern. At reference numeral 702, a default preamble pattern can be received. For example, the default preamble pattern can be received from at least one of a high speed memory manufacture, an OEM of the high speed memory, a host system, a system manufacture, a target environment, and/or any suitable entity (e.g., user, group of users, enterprise, factory, business, plant, company, machine, etc.) that can employ a high speed memory that utilizes a preamble pattern. At reference numeral 704, the default preamble pattern can be stored within a RAM module within a high speed memory. At reference numeral 706, a customized preamble pattern based upon a target environment for the high speed memory can be received. The customized preamble pattern can be specifically tailored to a host environment in which the high speed memory is employed. For instance, the customized preamble pattern can include an updated pattern, an updated preamble length, etc. Additionally, the customized preamble pattern can be received by, but not limited to, a high speed memory manufacture, an OEM of the high speed memory, a host system, a system manufacture, a target environment, and/or any suitable entity (e.g., user, group of users, enterprise, factory, business, plant, company, machine, etc.) that can employ a high speed memory that utilizes a preamble pattern. At reference numeral 708, the default preamble pattern within the RAM module can be altered (e.g., written, programmed, etc.) based upon receipt of the customized preamble pattern. At reference numeral 710, the customized preamble pattern can be stored within the RAM module. Furthermore, the high speed memory with the customized preamble pattern stored within the RAM module can be utilized within an environment.

Figure 8:
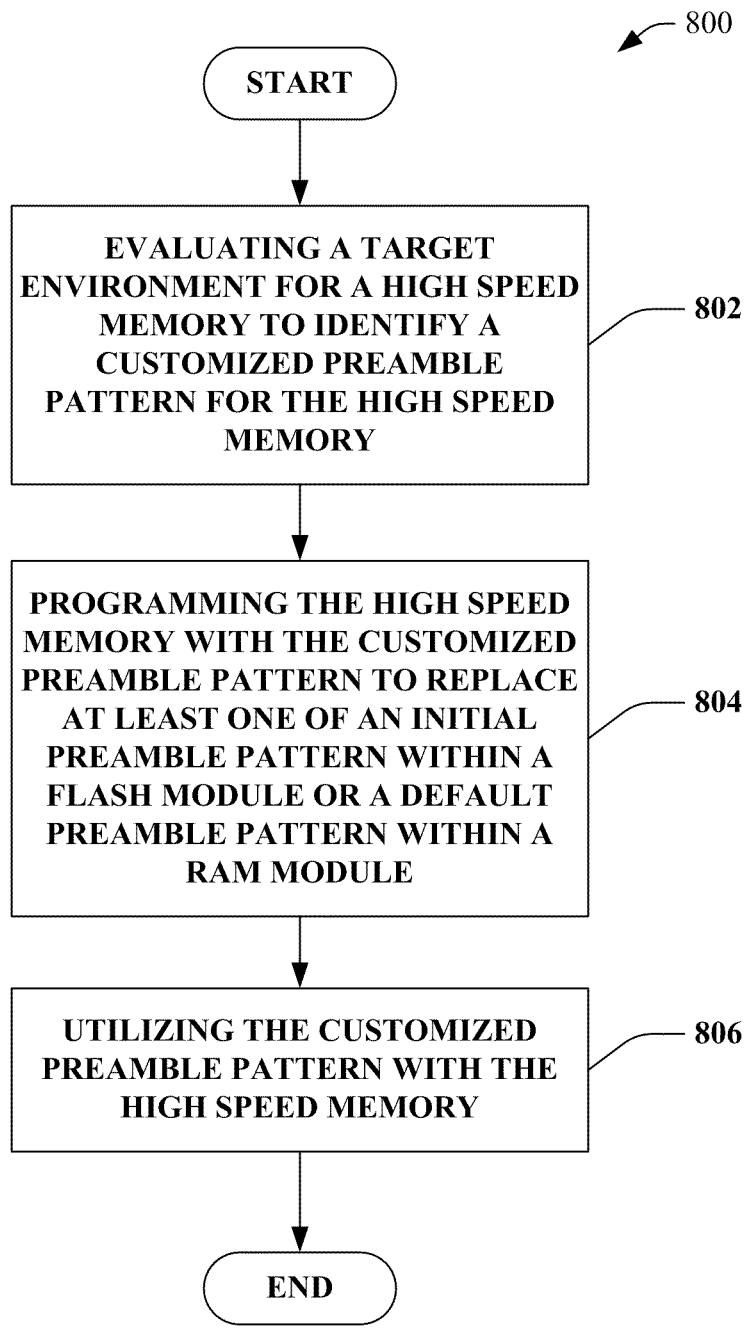
FIG. 8 illustrates an example methodology for programming a high speed memory with a customized preamble pattern based upon a target environment.

FIG. 8 illustrates a methodology 800 that facilitates programming a high speed memory with a customized preamble pattern based upon a target environment. At reference numeral 802, a target environment can be evaluated for a high speed memory in order to identify a customized preamble pattern for the high speed memory. In particular, the target environment (e.g., system manufacture, host system, host, entity, etc.) can be evaluated in order to identify a pattern that corresponds to the target environment. Additionally, the target environment can be evaluated in order to identify a preamble length for the preamble pattern. In general, the customized preamble pattern can be a preamble pattern that is specifically tailored to a particular environment in which the high speed memory is employed. At reference numeral 804, the high speed memory can be programmed with the customized preamble pattern to replace at least one of an initial preamble pattern within a FLASH module or a default preamble pattern within a RAM module. At reference numeral 806, the customized preamble pattern with the high speed memory can be utilized.

Figure 9:
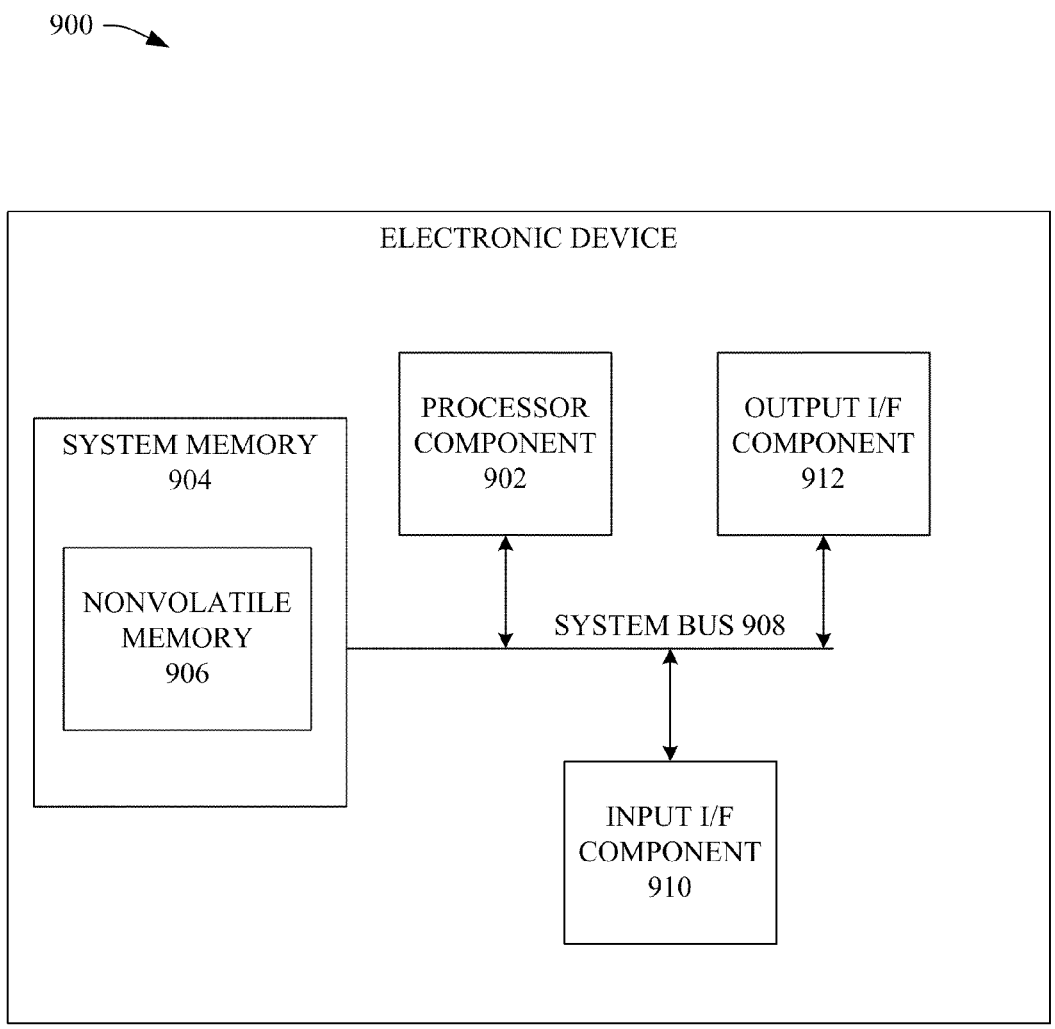
FIG. 9 is a block diagram of an exemplary, non-limiting electronic device that can employ a memory.

Referring to FIG. 9, illustrated is a block diagram of an exemplary, non-limiting electronic device 900 that can comprise and/or incorporate preamble 100, engine 200, engine 300, and/or engine 400, or a respective portion(s) thereof, and/or implement methodology 500, methodology 600, methodology 700, and/or methodology 800, or respective portions thereof. The electronic device 900 can include, but is not limited to, a computer, a laptop computer, network equipment (e.g., routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system or device (e.g., global position satellite (GPS) system), a secure memory device with computational capabilities, a device with a tamper-resistant chip(s), an electronic device associated with an industrial control system, an embedded computer in a machine (e.g., an airplane, a copier, a motor vehicle, a microwave oven), and the like. Moreover, it is to be appreciated that the preamble strategy described herein (e.g., RAM module, FLASH module, etc.) can be applied to any device that will drive the data bus during a read operation. Possible devices certainly include memories (e.g., high speed memory, a high speed memory device, a device that leverages high speed memory, a memory device, etc.) but also may include peripheral devices (e.g., LCD controller, analog to digital converters, etc.), non-memory devices, and also processing elements.

Components of the electronic device 900 can include, but are not limited to, a processor component 902, a system memory 904, which can contain a nonvolatile memory 906, and a system bus 908 that can couple various system components including the system memory 904 to the processor component 902. The system bus 908 can be any of several types of bus structures including a memory bus or memory controller, a peripheral bus, or a local bus using any of a variety of bus architectures.

Electronic device 900 can typically include a variety of computer readable media. Computer readable media can be any available media that can be accessed by the electronic device 900. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 906 (e.g., FLASH memory), or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 900. Communication media typically embodies computer readable instructions, data structures, program modules or other data in a modulated data signal such as a carrier wave or other transport mechanism and includes any information delivery media.

The system memory 904 can include computer storage media in the form of volatile (e.g., SRAM) and/or nonvolatile memory 906 (e.g., FLASH memory). For example, nonvolatile memory 906 can be the same or similar, or can contain the same or similar functionality, as memory component 902. A basic input/output system (BIOS), containing the basic routines that can facilitate transferring information between elements within electronic device 900, such as during start-up, can be stored in the system memory 904. The system memory 904 typically also can contain data and/or program modules that can be accessible to and/or presently be operated on by the processor component 902. By way of example, and not limitation, the system memory 904 can also include an operating system(s), application programs, other program modules, and program data.

The nonvolatile memory 906 can be removable or non-removable. For example, the nonvolatile memory 906 can be in the form of a removable memory card or a USB FLASH drive. In accordance with one aspect, the nonvolatile memory 906 can include FLASH memory (e.g., single-bit FLASH memory, multi-bit FLASH memory), ROM, PROM, EPROM, EEPROM, or NVRAM (e.g., FeRAM), or a combination thereof, for example. Further, a FLASH memory can comprise NOR FLASH memory and/or NAND FLASH memory. In accordance with another aspect, the nonvolatile memory 906 can comprise one or more memory components.

A user can enter commands and information into the electronic device 900 through input devices (not shown) such as a keypad, microphone, tablet, or touch screen although other input devices can also be utilized. These and other input devices can be connected to the processor component 902 through input interface component 910 that can be connected to the system bus 908. Other interface and bus structures, such as a parallel port, game port or a universal serial bus (USB) can also be utilized. A graphics subsystem (not shown) can also be connected to the system bus 908. A display device (not shown) can be also connected to the system bus 908 via an interface, such as output interface component 912, which can in turn communicate with video memory. In addition to a display, the electronic device 900 can also include other peripheral output devices such as speakers (not shown), which can be connected through output interface component 912.

It is to be understood and appreciated that the computer-implemented programs and software can be implemented within a standard computer architecture. While some aspects of the disclosure have been described above in the general context of computer-executable instructions that can be run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices (e.g., PDA, phone), microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

It is also to be understood and appreciated that cryptographic protocols can be employed to facilitate security of data associated with a memory (e.g., FLASH module, RAM module, etc.) in accordance with the disclosed subject matter. For example, a cryptographic component (e.g., cryptographic engine) can be employed and can facilitate encrypting and/or decrypting data to facilitate securing data being written to, stored in, and/or read from the memory. The cryptographic component can provide symmetric cryptographic tools and accelerators (e.g., Twofish, Blowfish, AES, TDES, IDEA, CAST5, RC4, etc.) to facilitate data security. The cryptographic component can also provide asymmetric cryptographic accelerators and tools (e.g., RSA, Digital Signature Standard (DSS), and the like) to facilitate securing data. Additionally, the cryptographic component can provide accelerators and tools (e.g., Secure Hash Algorithm (SHA) and its variants such as, for example, SHA-0, SHA-1, SHA-224, SHA-256, SHA-384, and SHA-512) to facilitate data security.

It is to be appreciated and understood that authentication protocols can be employed to facilitate security of data associated with the memory (e.g., RAM module, FLASH module, etc.) in accordance with the disclosed subject matter. For example, an authentication component can solicit authentication data from an entity, and, upon the authentication data so solicited, can be employed, individually and/or in conjunction with information acquired and ascertained as a result of biometric modalities employed, to facilitate control access to the memory. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by the authentication component. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

As used in this application, the terms "component," "module," "engine," "system," and the like are intended to refer to a computer-related entity, either hardware, firmware, a combination of hardware and software, software, or software in execution. For example, a component can be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component can be localized on one computer and/or distributed between two or more computers. In addition, these components can execute from various computer readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and FLASH memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A memory device, comprising:
   a FLASH module that includes an initial preamble pattern, wherein the initial preamble pattern is loaded during a power-up of a high speed memory;
   a RAM module that includes a default preamble pattern, wherein the default preamble pattern is loaded after the power-up of the high speed memory; and
   at least one of the initial preamble pattern within the FLASH module or the default preamble pattern within the RAM module identifies when a first data value arrives and data adjustment relative to a clock edge; wherein at least one of the initial preamble pattern within the FLASH module or the default preamble pattern within the RAM module is updated by a host system with a customized preamble pattern.

2. The memory device of claim 1, further comprising at least one of the initial preamble pattern or the default preamble pattern enables a host controller to capture data output by the high speed memory.

3. The memory device of claim 1, wherein the customized preamble pattern is based upon a target environment for the high speed memory.

4. The memory device of claim 3, further comprising at least one of a length of the customized preamble pattern or a pattern of the customized preamble pattern is adjusted based upon at least one of the host system or the target environment.

5. The memory device of claim 4, wherein the length of the customized preamble pattern is adjusted based upon a clock rate.

6. The memory device of claim 1, further comprising the initial preamble pattern is defined within the FLASH module by a manufacture of the high speed memory and at least one of the initial preamble pattern within the FLASH module or the default preamble pattern within the RAM module is defined by a host system or a system manufacture in which the high speed memory is employed.

7. The memory device of claim 1, further comprising a command module that enables a command based transfer to be implemented between the FLASH module and the RAM module after the power-up of the high speed memory.

8. The memory device of claim 1, further comprising a lock module that restricts programming of at least one of the initial preamble pattern within the FLASH module or the default preamble pattern within the RAM module.

9. The memory device of claim 8, further comprising the lock module restricts programming of the initial preamble pattern within the FLASH module based upon a detected programming to the initial preamble pattern by a host system.

10. The memory device of claim 9, further comprising the lock module restricts programming of the initial preamble pattern within the FLASH module based upon a number of a write/erase cycles.

11. The memory device of claim 10, further comprising the lock module restricts programming of the initial preamble pattern within the FLASH module to an erase and a write.

12. The memory device of claim 1, further comprising the lock module restricts programming of the default preamble pattern within the RAM module based upon at least one of a device reset or a subsequent power-up of the high speed memory, wherein the subsequent power-up is after the power-up.

13. The memory device of claim 1, further comprising a load module that loads the initial preamble pattern from the FLASH module to utilize as the default preamble pattern for the RAM module.

14. A method related to specifying a read preamble, comprising:
receiving an initial preamble pattern;
storing the initial preamble pattern within a FLASH module within a high speed memory;
receiving a customized preamble pattern based upon a target environment for the high speed memory;
erasing the initial preamble pattern within the FLASH module based upon receipt of an erase instruction; and
storing the customized preamble pattern within the FLASH module.

15. The method of claim 14, further comprising:
receiving the initial preamble pattern from at least one of a manufacture of the high speed memory or an Original Equipment Manufacturer (OEM) related to the high speed memory; and
receiving the customized preamble pattern from at least one of the OEM related to the high speed memory or a host system within the target environment of the high speed memory.

16. The method of claim 14, further comprising locking the FLASH module to restrict at least one of writing or erasing based upon receipt of the customized preamble pattern.

17. A method related to a memory device, comprising:
receiving an initial preamble pattern;
storing the initial preamble pattern within a FLASH module within a high speed memory;
receiving a default preamble pattern;
storing the default preamble pattern within a RAM module within the high speed memory;
receiving a customized preamble pattern based upon a target environment for the high speed memory;
altering at least one of the initial preamble pattern within the FLASH module or the default preamble pattern within the RAM module based upon receipt of the customized preamble pattern; and
storing the customized preamble pattern within at least one of the FLASH module or the RAM module.

18. The method of claim 17, further comprising:
receiving at least one of the initial preamble pattern or the default preamble pattern from at least one of a manufacture of the high speed memory or an Original Equipment Manufacturer (OEM) related to the high speed memory; and
receiving the customized preamble pattern from at least one of the OEM related to the high speed memory or a host system within the target environment of the high speed memory.

19. The method of claim 17, further comprising:
loading the initial preamble pattern from the FLASH module during a power-up of the high speed memory; and
loading the default preamble pattern from the RAM module after the power-up of the high speed memory; and
utilizing at least one of the initial preamble pattern from the FLASH module or the default preamble pattern from the RAM module to identify when a first data value arrives and data adjustment relative to a clock edge.

20. The method of claim 17, further comprising adjusting at least one of a pattern of the customized preamble pattern or a length of the customized preamble pattern based upon at least one of a host system or the target environment, wherein the length of the customized preamble pattern is adjusted based upon a clock rate.

* * * * *